(12) United States Patent
Lutz

(10) Patent No.: US 6,789,249 B2
(45) Date of Patent: Sep. 7, 2004

(54) BOOLEAN GATE DEFINITION

(75) Inventor: Robert J. Lutz, Chippewa Falls, WI (US)

(73) Assignee: Cray, Inc., Seattle, WA (US)

( * ) Notice: Subject to any disclaimer, the term of this patent is extended or adjusted under 35 U.S.C. 154(b) by 0 days.

(21) Appl. No.: 10/185,177

(22) Filed: Jun. 28, 2002

(65) Prior Publication Data
US 2004/0003367 A1 Jan. 1, 2004

(51) Int. Cl.[7] .............................................. G06F 17/50
(52) U.S. Cl. ................................. 716/18; 716/1; 716/2
(58) Field of Search .............................. 716/1, 2, 3, 4, 716/5, 6, 11, 17, 18

(56) References Cited

U.S. PATENT DOCUMENTS

| | | | | |
|---|---|---|---|---|
| 6,110,223 A | * | 8/2000 | Southgate et al. | 716/18 |
| 6,161,211 A | * | 12/2000 | Southgate | 716/1 |
| 6,378,123 B1 | * | 4/2002 | Dupenloup | 716/18 |
| 6,430,732 B1 | * | 8/2002 | Hwang et al. | 716/11 |
| 6,438,730 B1 | * | 8/2002 | Atmakuri et al. | 716/1 |

* cited by examiner

Primary Examiner—Vuthe Siek
Assistant Examiner—Binh Tat
(74) Attorney, Agent, or Firm—Schwegman, Lundberg, Woessner & Kluth, P.A.

(57) ABSTRACT

A method of instantiating a leaf cell having various connections and designed to be called using a fixed syntax includes defining a template syntax different from the fixed syntax, setting default values for connections not designated by the template syntax, and mapping the template syntax to a hardware design language. The description of the leaf cell has values for the designated connections and non-designated connections. The non-designated connections have the default values. Another method includes instantiating a leaf cell using a first template syntax or a second template syntax. The second template syntax instantiates the same leaf cell as the first template syntax or the fixed syntax. In addition, more than one leaf cell, also known as a branch, can be instantiated using the template syntax. Articles of manufacture that include a computer readable media having instructions thereon for causing a suitably programmed system to execute one or more of the above methods of instantiating a leaf cell or leaf cells are also discussed.

19 Claims, 5 Drawing Sheets

```
201 — define mux2              414  412
202 — template $1 = mux($2, $3):$4 $5
204 — template $1 = mux($2 $3):$4 $5
        ┌ verilog $& x$1(
        │   .z($1),
        │   .a($2),
        │   .s0($4),
        │   .s0_b($5),
  220 ──┤   .b($3),
        │   .s1($5),
        │   .s1_b($4)
        └ )
206 — template $1 = mux($2 : $3 $4, $5 : $6 $7)
208 — template $1 = mux($2 : $3 $4 $5 : $6 $7)
        ┌ verilog $& x$1(
        │   .z($1),
        │   .a($2),
        │   .s0($3),
        │   .s0_b($4),
  222 ──┤   .b($5),
        │   .s1($6),
        │   .s1_b($7)
        │ )
        └ end
```

Fig. 2

```
Syntax BNF - (BGD)
rule 1  file_bgd -> bgd_cmd_list_opt
rule 2  bgd_cmd_list_opt -> /* empty */
rule 3  bgd_cmd_list_opt -> bgd_cmd_list
rule 4  bgd_cmd_list -> bgd_cmd
rule 5  bgd_cmd_list -> bgd_cmd_list bgd_cmd
rule 6  bgd_cmd -> set_cmd
rule 7  bgd_cmd -> define_cmd
rule 8  set_cmd -> YYL_SET YYL_STOKEN '=' YYL_STOKEN
rule 9  define_cmd -> define_def_line define_body define_end
rule 10 define_def_line -> define_def define_name_list
rule 11 define_def -> YYL_DEFINE
rule 12 define_name_list -> define_name
rule 13 define_name_list -> define_name_list define_name
rule 14 define_name_list -> define_name_list ',' define_name
rule 15 define_name -> YYL_DTOKEN
rule 16 define_body -> define_entry_list_opt
rule 17 define_entry_list_opt -> /* empty */
rule 18 define_entry_list_opt -> define_entry_list
rule 19 define_entry_list -> define_entry
rule 20 define_entry_list -> define_entry_list define_entry
rule 21 define_entry -> template_verilog_pair
rule 22 template_verilog_pair -> template_line_list verilog_line_list
rule 23 template_line_list -> template_line
rule 24 template_line_list -> template_line_list template_line
rule 25 template_line -> template_def template_token_list
rule 26 template_def -> YYL_TEMPLATE
rule 27 template_token_list -> template_token
rule 28 template_token_list -> template_token_list template_token
rule 29 template_token -> YYL_TTOKEN
rule 30 verilog_line_list -> verilog_line
rule 31 verilog_line_list -> verilog_line_list verilog_line
rule 32 verilog_line -> verilog_def '(' verilog_pin_list ')'
rule 33 verilog_line -> verilog_def '(' verilog_pin_list ')' ';'
rule 34 verilog_def -> YYL_VERILOG YYL_VTOKEN YYL_VTOKEN
rule 35 verilog_pin_list -> verilog_pin
rule 36 verilog_pin_list -> verilog_pin_list verilog_pin
rule 37 verilog_pin_list -> verilog_pin_list ',' verilog_pin
rule 38 verilog_pin -> '.' YYL_VTOKEN
rule 39 verilog_pin -> '.' YYL_VTOKEN '(' ')'
rule 40 verilog_pin -> '.' YYL_VTOKEN '(' YYL_VTOKEN ')'
rule 41 define_end -> YYL_END define_end_list_opt
rule 42 define_end_list_opt -> /* empty */
rule 43 define_end_list_opt -> define_end_list
rule 44 define_end_list -> YYL_ETOKEN
rule 45 define_end_list -> define_end_list YYL_ETOKEN
```

Fig.3

BOOLEAN GATE DEFINITION

FIELD OF THE INVENTION

The present invention relates to an apparatus and method for designing circuits. More specifically, the invention relates to instantiating one or more leaf cells using a customizable syntax which differs from the fixed or given syntax used to instantiate a single leaf cell.

BACKGROUND OF THE INVENTION

Electronic components are becoming increasingly complex as more and more capability is being designed into the electronic components. Typically, the more complex an electrical component becomes, the greater number of semiconductor devices that need to be used to form the circuits that carry out the functions.

In the past, circuits were designed from scratch. The circuits were designed using a graphical tool to draw schematic diagrams of the circuits. Designers use a graphical program, such as Composer which is available from Cadence, Inc. of San Jose, Calif. Drawing the schematic is actually a graphical process in which the designer uses symbols to designate one of various types of transistors, such as for an NMOS or PMOS transistor. A number of transistors are designated with the transistor type, and then a wiring feature is used to connect terminals of all the designated devices together. The designer provides input ports and output ports and annotates the symbols to specify certain properties for a particular transistor. The properties specified include length and width of a gate of a transistor. Other size properties may also be designated. In short, past efforts for circuit design include a graphical way of trying to describe the particular components and the way the components are connected.

Before actually building the circuit, several tests are performed on the circuit as designed. The first test is a functional simulation. The functional simulation attempts to assure that the design of the circuit is correct. In other words, for a certain set of inputs, the circuit should produce a certain set of outputs in order for the circuit to be correctly carrying out a function. A first series of scripts or procedures are applied to the graphical data used to design the circuit. The series of scripts or procedures converts the graphical data to a hardware description language ("HDL"). One commonly used HDL is known as Verilog. Once the HDL is formed, a simulation program, such as VCS Simulator available from Synopsis of Mountain View, Calif. is used to test the functionality of the circuit. Verilog is a HDL that is used to interconnect the blocks for the purpose of running a functional simulation test.

Another trend is to design at least some portions of a circuit from certain building blocks (called leaf cells) which include a group of transistors. Rather than design a circuit totally from scratch, the circuit is designed by connecting these building blocks or leaf cells. This trend is valuable especially since circuits have increasingly become much more complex. In designing the circuit, a designer sets out the parameters for a leaf cell and also sets out the connections to other leaf cells which comprise a portion of the circuit. Circuit designers can now design circuits more quickly since certain functions are already designed in blocks or leaf cells. A major portion of the circuit design can be accomplished by linking the various leaf cells. The resulting circuit designs can be accomplished more quickly. Furthermore, the calling up of set leaf cells prevents or makes mistakes less likely in the leaf cells.

Calling up a leaf cell includes designating the type of leaf cell, the parameters to be associated with the leaf cell and designating the connections to the various inputs and outputs of the leaf cell. Providing the parameters and providing the connections to the leaf cell is called instantiation. To instantiate leaf cells to describe the variables associated with the leaf cell and to describe the interconnections between leaf cells circuit designers use a very specific syntax and semantics. For example, Verilog is one program used to call up leaf cells and instantiate them in a circuit and produce HDL for the circuit. In Verilog, there are typically two methods of instantiation. One instantiation method requires the designer to use a specific set of symbols that represent an ordered connection. The first method of instantiation, is based on the order of the various symbols. The designer has to know the order of the symbols for calling a particular macro in Verilog. In Verilog, for example, the output is listed first and then the particular pin associated with the output. The second method of instantiation in Verilog is to designate a pin based connection. In the pin based connection type of instantiation, the designer calls out the pin. After calling out the pin, the designer designates the net connected to the pin in parenthesis.

The current methods of instantiation of an HDL have problems. Among the problems are that the designer had to use a fixed syntax in order to instantiate a leaf cell in a design. The designer must know what that order is and then the nets to match that order. If the specific syntax is not used, errors arise which need to be corrected later before a proper and accurate simulation can be accomplished. In other words, there is no option for customizing or for a user to provide his or her own syntax for instantiating leaf cells. Another problem is that when a cell has a large number of input/output pins, there is a relatively large margin for errors which can slow down the design of a circuit using the leaf cells. Still a further disadvantage is that the fixed syntax does not have the capability to call more than a single leaf cell.

SUMMARY OF THE INVENTION

A method of instantiating a leaf cell having various connections and designed to be called using a fixed syntax includes defining a template syntax different from the fixed syntax, setting default values for connections not designated by the template syntax, and mapping the template syntax to a hardware design language. The hardware design language describes the leaf cell. The description of the leaf cell has values for the designated connections and non-designated connections. The non-designated connections have the default values. The method also includes calling a leaf cell using the template syntax. When using the template syntax, in some embodiments, less than all the connections are designated. Variables may also be set in the template syntax to reference positional nets matching the leaf cell called. In some embodiments, the hardware design language describing the leaf cell is a Verilog statement. In other embodiments, the method further includes defining a second template syntax different than the first template syntax and the fixed syntax. The second template syntax instantiates the same leaf cell as the first template syntax or the fixed syntax.

The invention also includes an article of manufacture comprising a computer readable media having instructions thereon for causing a suitably programmed system to execute the method of instantiating a leaf cell having various connections and designed to be called using a fixed syntax includes defining a template syntax different from the fixed syntax, setting default values for connections not designated by the template syntax, and mapping the template syntax to a hardware design language.

Also disclosed is a method of instantiating a leaf cell having various connections and designed to be called using a fixed syntax, the method includes defining a first template syntax different from the fixed syntax, and defining a second template syntax different from the fixed syntax and different from the first template syntax. The method also includes mapping the first template syntax and the second template syntax to a hardware design language describing the leaf cell in which designated connections have values. Default values are set for connections not designated by the first template syntax. The method further includes setting default values for connections not designated by the first template syntax; and setting default values for connections not designated by the second template syntax. In one embodiment, the leaf cell is called using the first template syntax. Variables are set to reference positional nets matching the leaf cell called. In another embodiment, the leaf cell is called using the second template syntax. In some embodiments, the hardware design language describing the leaf cell is a Verilog statement. Also disclosed is an article of manufacture including a computer readable media having instructions thereon for causing a suitably programmed system to execute the method of instantiating a leaf cell having various connections and designed to be called using a fixed syntax, the method includes defining a first template syntax different from the fixed syntax, and defining a second template syntax different from the fixed syntax and different from the first template syntax, and mapping the first template syntax and the second template syntax to a hardware design language describing the leaf cell in which designated connections have values.

Another method is for instantiating a plurality of leaf cells having various connections. The leaf cells are designed to be called separately using a fixed syntax. The method defines a template syntax different from the fixed syntax. The template syntax defines a first leaf cell and a second leaf cell, and maps the template syntax to a hardware design language describing the first leaf cell and the second leaf cell and the connections to one another. This method also includes setting default values for connections not designated by the template syntax for the first leaf cell, and setting default values for connections not designated by the template syntax for the second leaf cell. In addition, the method also includes designating default values for the first leaf cell and the second leaf cell for connections not designated by the template syntax.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

FIG. 2 is an example of the BGD template definition.

FIG. 3 is a listing in Backus Naur Format ("BNF").

The description set out herein illustrates the various embodiments of the invention and such description is not intended to be construed as limiting in any manner.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
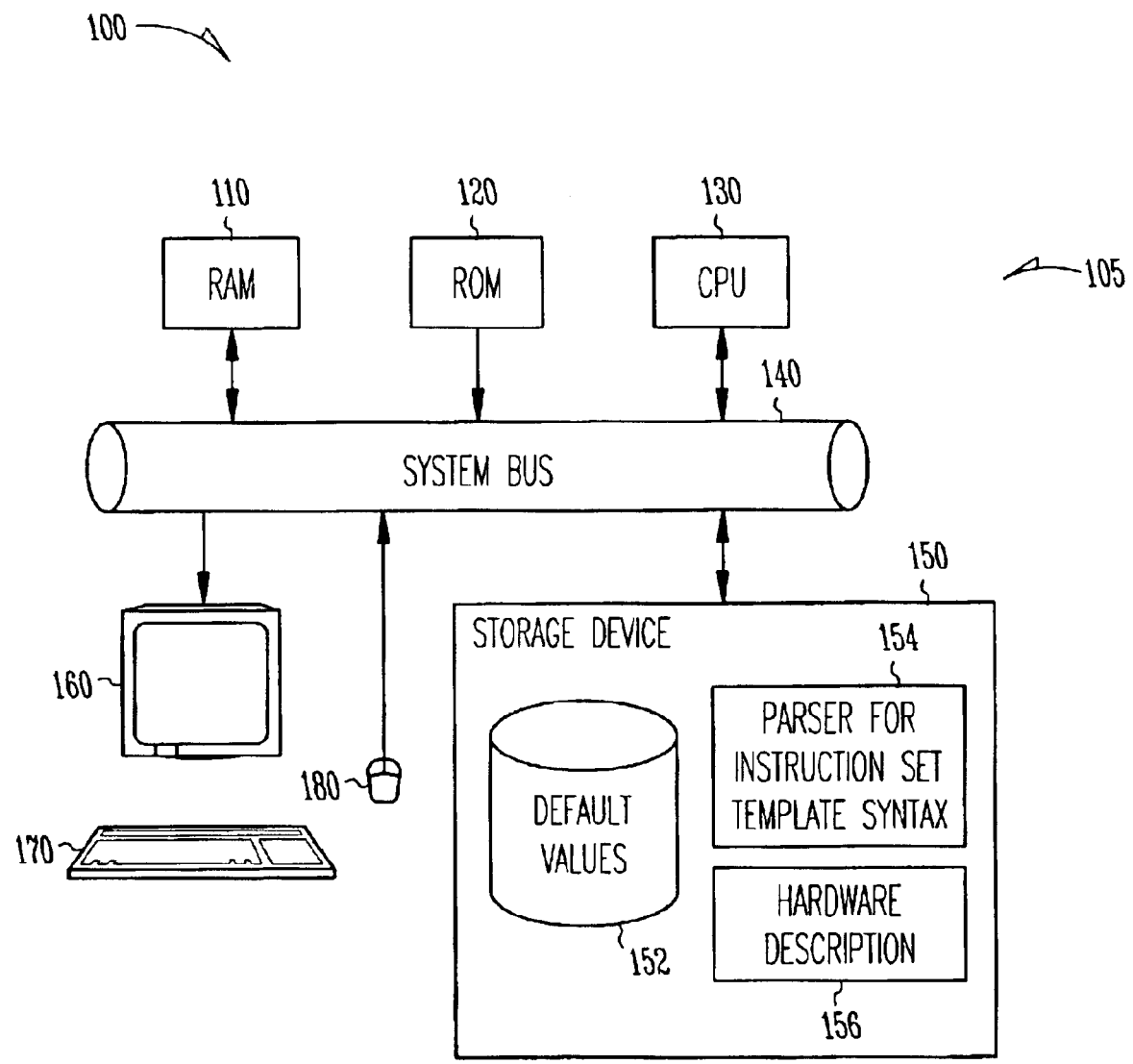
FIG. 1 is a block diagram of the electronic instantiating system consistent with the present invention.

FIG. 1 is a block diagram of the electronic information handling system, such as a computer work station or personal computer 100, consistent with the present invention. The computer work station or personal computer system 100 consistent with the present invention may be implemented using a conventional personal computer, such as an IBM compatible personal computer. FIG. 1 shows the computer system 100 and the architecture 105 of one such computer system 100 for executing a first instantiation program and a second instantiation program as part of the computer system. As shown, architecture 105 uses system bus 140 to connect RAM 110, ROM 120, CPU 130, storage device 150, monitor 160, keyboard 170, and mouse 180. These are all standard components of an information handling system, such as a personal computer or work station. For example, CPU 130 may be a microprocessor manufactured by Intel Corp. or manufactured by Advanced Micro Devices or the like. Likewise, the other components are generally standard on most personal computers or workstations, with one exception, the storage device 150. The storage device 150 includes several components. The components include database 152 which includes default values for various connections, at least one template instantiation instruction set 154, and a hardware description language 756 such as Verilog. A parser 154 for parsing the template syntax to Verilong instance lines for a leaf cell is also included in the database 152. The Verilog instance lines conform to the fixed instantiation set which is part of the IEEE standard associated with Verilog.

Database 152 includes a variety of information, including rules relating the template instantiation program and when to use default values. The data base includes a parser for parsing the commands of the template instantiation program into the standard Verilog statements and assigning different values to the connections on the inputs and outputs of the leaf cell. In some embodiments, the rules include rules for assigning interconnections between at least two leaf cells (termed a branch) as well as the inputs and outputs to the branch.

Leaf cells are logic building blocks that carry out typical functions in a circuit. For example, there are leaf cells that perform a latching function and leaf cells that perform as a multiplexer. All sorts of other functions are performed by leaf cells. Specific leaf cells are called during circuit design to perform various functions. In this way, the circuit designer does not have to design the circuit from the ground up. The circuit designer calls up various leaf cells to provide the hardware for various functions in the circuit. Instantiation includes providing the connections to the various inputs and outputs of the leaf cell as well as any variable values associated with the leaf cell. The instantiation process generally includes using a set of standard or fixed rules defined in an IEEE standard associated with a hardware description language called Verilog.

The instant invention includes the ability of the circuit designer to form a template instantiation program which calls the Verilog instances. The circuit designer or user defines a template syntax for instantiating a leaf cell or group of leaf cells in a circuit design. In other words, the circuit designer is allowed to define a set of customized instantiation instruction sets. This allows the circuit designer many advantages. Among the advantages is that the circuit designer can include default connections or default values in the templates. Another advantage is that complex gate functions can have simplified syntax instantiations. Yet another advantage is that the designer can use his or her own style so as to make instantiation more effective for the particular designer. Furthermore, the instantiation will be more readable.

Boolean Gate Definition ("BGD") is a file format which is a template definition to map a boolean syntax instance line which is created by a user, such as a circuit designer, into a Verilog line. The BGD definition can have multiple template/verilog pairs. Typically, the first match of the boolean line with the template is used. The BGD information can exist in a separate file or be included as a special Verilog comment in Transistor Level Verilog, which is the subject of a copending application filed Jun. 26, 2002 and entitled "Transistor Level Verilog".

Of course the BGD file format allows for comments to be inserted within lines of code. Generally, the comments take the following generalized form:

. . . <any text to end of line>

A comment starts with the # character and continues to the end of the line. It can be added to any statement or exist as just a comment line. All comments are ignored and treated as whitespace in the syntax. Set forth below are two examples of comments:

- - -comment- - - define adder1 #64 bit adder module

Variables can also be designated in BGD. Generally, the variables take on one of the following generalized forms:

$NUM ${NUM}

A variable always starts with the $ character. The { } characters are used to delineate the variable NUM in a compound string generation. The variables are used to refernce the positional nets that match the template call. The special variable $& is used to reference the module name in a Verilog statement. The special variable $$ is used to represent a program generated unique instance name for a Verilog statement. Set forth below are several example lines that include variables:

template $3=and ($1, $2)

template $9=~$1 verilog $& $$ (.A($1), .Z($2));

The BGD file format includes several Keywords that are used to define statements in in BGD. The keywords are set forth below and will be described in more detail in the paragraphs that follow.

define set template verilog end

The syntax of the BGD file format requires that a statement starts in column 1 of a new line, so these keywords only have meaning at the start of a new line. Any other use of these keywords is syntactically legal but should be avoided.

The define Statement of the BGD is used to start and name a new BGD definition. Generally, the define statement takes on one of the following generalized form:

define NAME

The NAME represents the gate name to be used in matching the boolean call line. Set forth below is an example define statement for an adder:

define adder1

The template statement defines a sequence of variables and delimiters to be used in matching a boolean instance line. The template statement takes on the following generalized form:

template VARIABLE [DELIM}|[VARIABLE] . . .

The delim can be any non-variables. The template definition can also span multiple lines. A new BGD keyword indicates the end of the template definition. Set forth below are several example template statements:

template $1=$2+$3 template $9=mux($2, $3: dcd($4)

template $1=

$3|$4+$5&$6;

The Verilog statement is used to define the mapping of the template statement to a Verilog instance. Set forth below is a generalized example of a Verilog Statement:

verilog gate inst(.pin(VAR), . . . );

The nets connected to pins are typically defined as a VAR which is the positional net defined by the call line in the boolean. The special case variable $& can be used in the gate field to represent the name in the define statement. The special case variable $$ can be used in the inst field to represent a unique program generated instance name.

The end statement defines the end of the BGD definition. The end statement is set forth below:

end

FIG. 2 is an example of the BGD template definition. The example is for a MUX 2, as depicted by the define line having the reference number 401. In the example, there are four template statements 402, 404, 406 and 408 defined. Any one of the four template statements can be used to call the MUX2. A user, such as a circuit designer using BGD, is allowed to use this MUX2 by implementing one of the four template statements 402, 404, 406 and 408. The first two template statements 402, 404 are very similar. Template statement 402 allows the user to place a comma between the two MUX terms. Template statement 404 indicates that the user does not need a comma between the two MUX terms.

A parsing program scans through the BGD file and checks for a series of tokens, such as token 412, and a series of delimiters, such as delimiter 414 to find a match for the template statement 402, 404, 406 or 408. Actually, the parsing program checks the entire statement and determines a match. For example, the parsing program checks for MUX2 if you have a symbol, and equal sign, MUX, a begin parentheses, a symbol, a comma, a symbol, an end parenthesis, a colon, a symbol, a space, and a symbol, to determine a match for the first template statement 402. The delimiters 414 are the symbols used to match the template statement. The tokens are variables that are associated with the template statement. When a a match is found, the tokens assigned to the dollar sign delimiters are variables. Once a match is found, an assignment to a Verilog statement 420 takes place. The Verilog statement 420 is listed below the template statement or statements 402, 404. In the example, when a match is found to one of the first two template statements, the Verilog statement 420 is assigned. The Verilog statement 420 is the line that will be generated in Verilog for the given template statements 402, 404. Similarly, the Verilog statement 422 is generated when a match is found for either template statement 406 or 408. In summary, the format is when a cell is defined, one or a series of template statements that all are considered equivalent can be set forth. Once a match is found, the Verilog statement following the template is used to generate the Verilog. There are a group of template and Verilog pairs where the template can be a series of templates used to produce Verilog lines by following the Verilog statement, such as 420, 422.

FIG. 3 is a listing in Backus Naur Form ("BNF"). BNF is a way to define rules that describe the syntax in BGD. BNF is a formal notation used to describe the syntax of a given language, such as BGD. BNF format is typically used to define a parser for many programs. A utility program called Yet Another Compiler Compiler ("Yacc") and another program called Lex are used to form a parser. Both LEX and YACC are available for UNIX-based systems from Sun Microsystems, Inc., 4150 Network Circle, Santa Clara, Calif. Lex and Yacc are a complementary pair of languages for writing parsers. They are popular and widely available versions of what are called Parser Generators. Each generates C functions as output. Lex implements regular expressions, while Yacc implements Backus-Naur Form, a formal syntax for language grammars. YAK is a common tool for C Language and is a common tool for a parser. The set of BNF rules displayed in FIG. 3 was used to code up a LEX and a Yacc file which is used to generate a parser for the BGD syntax.

Figure 4:
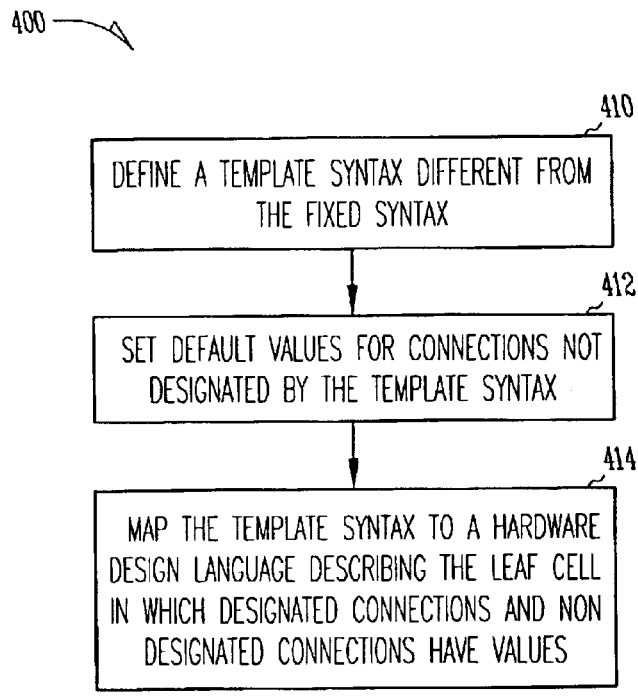
FIG. 4 is a flowchart of a method using the BGD format to instantiate a leaf cell which includes default values for inputs or outputs which are not designated in the BGD format.

FIG. 4 is a flowchart of a method 400 using the BGD format to instantiate a leaf cell which includes default values for inputs or outputs which are not designated in the BGD format. In other words, in the BGD format default values can be designated for connections or for other values so that a circuit designer does not have to always include each and every value for each and every connection to instantiate a leaf cell. Method 400 includes defining a template syntax different from a fixed syntax, as depicted by reference numeral 410. The fixed syntax is considered the Verilog syntax that requires all variables to be named in certain positions in the Verilog syntax. A template syntax is defined which includes default values for any connections that are not designated by the template syntax, as depicted by reference numeral 412. Thus, when defining a template syntax it is possible to define default values for each and every connection of the leaf cell that will be instantiated. If the connection is not designated in the template syntax, then the BGD will insert the default value for the connection value. Finally, the template syntax is mapped to the hardware design language describing the leaf cell in which both designated connections and non-designated connections have values, as depicted by reference numeral 414. It is contemplated that Verilog is one of the hardware designed languages that could be used or called by a BGD template match, as shown in FIG. 2, which is an example of a BGD template definition.

An example of the BGD with a default connection as well as an example of the instantiation which results from the BGD is provided below:

```
# BGD example with default connection to .CLK
    define latch1
        template $1 = latch($2)
        verilog $& x$1( .Q($1), .D($2), .CLK(my_clk) )
    end
------------------------------------------------------------
# example instantiation
    latch1 out_net = latch (in_data)
# resultant verilog
    latch1 xoutnet( .Q(out_net), .D(in_data), .CLK(my_clk) );
```

Figure 5:
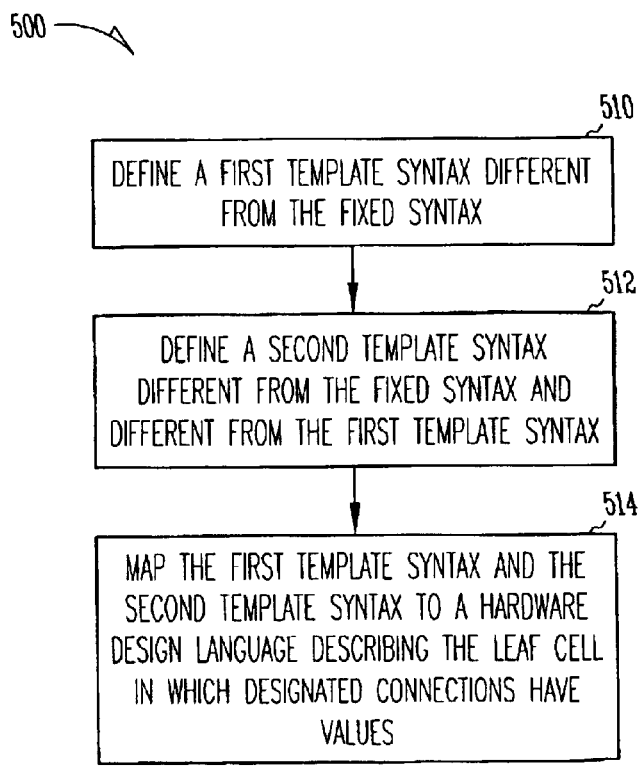
FIG. 5 is a flowchart of a method 500 using the BGD format to instantiate a leaf cell in which a first template syntax and a second template syntax can be used to instantiate the same leaf cell.

FIG. 5 is a flowchart of a method 500 using the BGD format to instantiate a leaf cell in which a first template syntax and a second template syntax can be used to instantiate the same leaf cell. This is advantageous in that a designer may want to instantiate a leaf cell using two different types of template syntaxes which he or she defines. Also, if more than one designer is using a specific BGD format to instantiate leaf cells, a first designer could produce a first template syntax which he is familiar with, and a second circuit designer could produce a second template syntax, which is more familiar to him or her. The method 500 includes defining a first template syntax different from the fixed syntax, as depicted by reference numeral 510, and defining a second template syntax different from the fixed syntax and different from the first template syntax, as depicted by reference numeral 512. The fixed syntax is again a fixed or very defined hardware description language such as Verilog which requires that each of the variables be set forth in a specific position within the syntax to properly invoke the syntax. Lastly, the first template syntax and the second template syntax are mapped to a hardware design language describing a leaf cell in which the designated connections have values, as depicted by reference numeral 514. It is contemplated that in some embodiments either the first or the second template syntax may include default values for connections which can be invoked when the connections are not designated in the syntax used in the BGD. It should be noted that FIG. 2 includes an instance where a first template syntax and a second template syntax are defined and refer to the same leaf cell.

An example of the BGD with two template syntax statements as well as an example of the instantiation which results from the BGD is provided below

```
# BGD example with 2 templates
    define and3
        template $1 = $2 & $3 & $4
        template $1 = and( $2, $3, $4 )
        verilog $& x$1( .Q($1), .A($2), .B($3), .C($4) )
    end
------------------------------------------------------------
# example instantiation 1
    and3 out_net = in1 & in2 & in3
# resultant verilog
    and3 xout_net( .Q(out_net), .A(in1), .B(in2), .C(in3) );
# example instantiation 2
    and3 out_net = and( in1, in2, in3 )
# resultant verilog
    and3 xout_net( .Q(out_net), .A(in1), .B(in2), .C(in3) );
```

Figure 6:
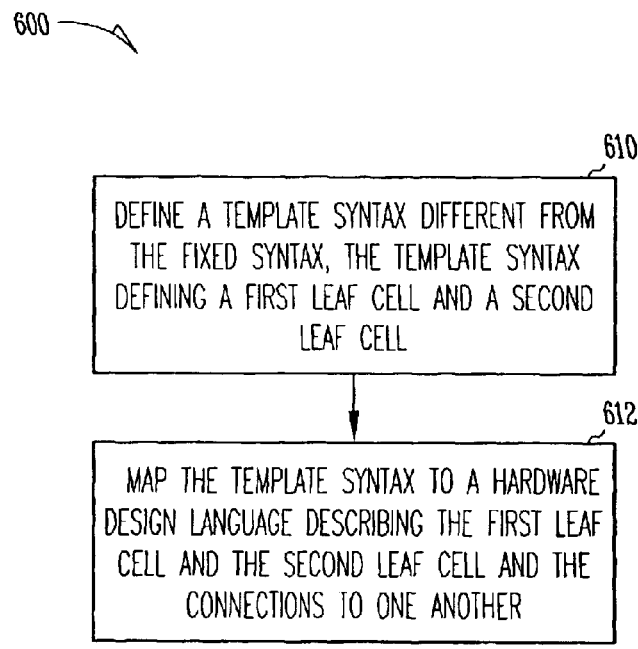
FIG. 6 is a flowchart of a method 600 using BGD format to instantiate a branch including at least a first leaf cell and a second leaf cell.

FIG. 6 is a flowchart of a method 600 using BGD format to instantiate a branch including at least a first leaf cell and a second leaf cell. Initially a template syntax different from a fixed syntax is used to define a first leaf cell and a second leaf cell and the interconnections there between, as depicted by reference numeral 610. Next, the template syntax is mapped to a hardware design language describing the first leaf cell and the second leaf cell and the connections between the two leaf cells, as depicted by reference numeral 612. It is contemplated that at least two leaf cells could be instantiated with one another. When a pair of leaf cells are instantiated, it is generally referred to as a branch. It is further contemplated that more than two leaf cells are a plurality or a multiplicity of leaf cells could be instantiated together using the BGD described herein.

An example of the BGD and instantiation of a first leaf cell (buffer), a second cell (buffer) and a third leaf cell (buffer) is provided below:

```
define delay1
      template $1 = $2
      verilog buffer x1$1( .Q(tmp1), .A($2) );
      verilog buffer x2$1( .Q(tmp2), .A(tmp1) );
      verilog buffer x3$1( .Q($1), .A(tmp2) );
      end
------------------------------------------------------------
# example instantiation
delay1 out_net = in_net
# resultant verilog
buffer x1out_net( .Q(tmp1),          .A(in_net)10 );
buffer x2out_net( .Q(tmp2),          .A(tmp1)    );
buffer x3out_net( .Q(out_net),       .A(tmp2)    );
```

Producing BGD and verilog for three leaf cells is also known as producing BGD and verilog for a branch (more than one leaf cell.

Other uses of BGD are contemplated and within the scope of this invention. For example, multiple templates can be used to define alternate versions of a BGD format. Another use is that multiple Verilog lines can be used to represent the function of the template line. In addition, Verilog nets can be formed by concatenating text and variables, as set forth in the following example:

net${1}_temp

Figure 7:
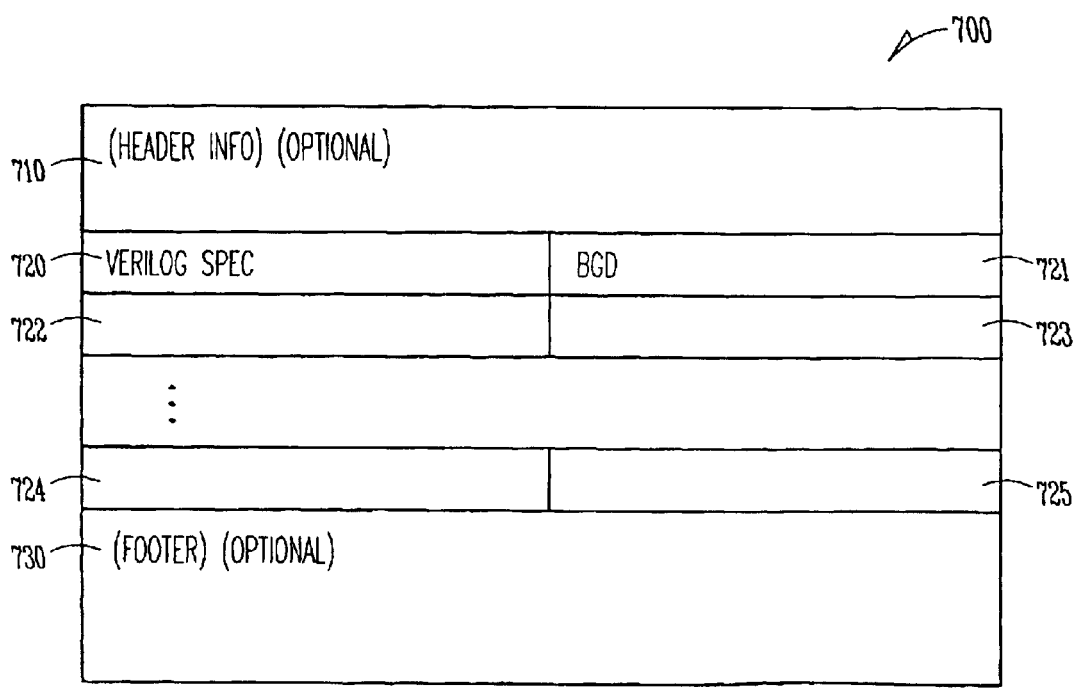
FIG. 7 is shows a data set which is converted from the BGD template syntax to VerilogHardware Description Language.

FIG. 7 depicts a data set for data structure 700, which includes optional header information 710 and optional footer information 730. Between the header 710 and the footer 730 are a number of records of data 720, 722, 724, 721, 723 and 725. In actuality, there can be N records of data, as depicted by the three dots between data records 722 and 724. Each record includes a Verilog specification 720 and a BGD specification 721. In other words, the data structure sets forth or specifies data necessary to produce a Verilog listing, such as records, which would be found in portions of the records 720, 722 and 724, and portions which are necessary to execute a template syntax in BGD and match it to Verilog. In other words, the records also include a BGD specification portion 721, 723, 725 and Verilog portions 720, 722, 724.

CONCLUSION

In conclusion, a method of instantiating a leaf cell having various connections and designed to be called using a fixed syntax includes defining a template syntax different from the fixed syntax, setting default values for connections not designated by the template syntax, and mapping the template syntax to a hardware design language. The hardware design language describes the leaf cell. The description of the leaf cell has values for the designated connections and non-designated connections. The non-designated connections have the default values. The method also includes calling a leaf cell using the template syntax. When using the template syntax, in some embodiments, less than all the connections are designated. Variables may also be set in the template syntax to reference positional nets matching the leaf cell called. In some embodiments, the hardware design language describing the leaf cell is a Verilog statement. In other embodiments, the method further includes defining a second template syntax different than the first template syntax and the fixed syntax. The second template syntax instantiates the same leaf cell as the first template syntax or the fixed syntax.

The invention also includes an article of manufacture comprising a computer readable media having instructions thereon for causing a suitably programmed system to execute the method of instantiating a leaf cell having various connections and designed to be called using a fixed syntax includes defining a template syntax different from the fixed syntax, setting default values for connections not designated by the template syntax, and mapping the template syntax to a hardware design language.

Also disclosed is a method of instantiating a leaf cell having various connections and designed to be called using a fixed syntax, the method includes defining a first template syntax different from the fixed syntax, and defining a second template syntax different from the fixed syntax and different from the first template syntax. The method also includes mapping the first template syntax and the second template syntax to a hardware design language describing the leaf cell in which designated connections have values. Default values are set for connections not designated by the first template syntax. The method further includes setting default values for connections not designated by the first template syntax; and setting default values for connections not designated by the second template syntax. In one embodiment, the leaf cell is called using the first template syntax. Variables are set to reference positional nets matching the leaf cell called. In another embodiment, the leaf cell is called using the second template syntax. In some embodiments, the hardware design language describing the leaf cell is a Verilog statement. Also disclosed is an article of manufacture including a computer readable media having instructions thereon for causing a suitably programmed system to execute the method of instantiating a leaf cell having various connections and designed to be called using a fixed syntax, the method includes defining a first template syntax different from the fixed syntax, and defining a second template syntax different from the fixed syntax and different from the first template syntax, and mapping the first template syntax and the second template syntax to a hardware design language describing the leaf cell in which designated connections have values.

Another method is for instantiating a plurality of leaf cells having various connections. The leaf cells are designed to be called separately using a fixed syntax. The method defines a template syntax different from the fixed syntax. The template syntax defines a first leaf cell and a second leaf cell, and maps the template syntax to a hardware design language describing the first leaf cell and the second leaf cell and the connections to one another. This method also includes setting default values for connections not designated by the template syntax for the first leaf cell, and setting default values for connections not designated by the template syntax for the second leaf cell. In addition, the method also includes designating default values for the first leaf cell and the second leaf cell for connections not designated by the template syntax.

The invention also includes an article of manufacture comprising a computer readable media having instructions thereon for causing a suitably programmed system to execute the method for instantiating a plurality of leaf cells having various connections.

A data structure includes a plurality of command records each following a template syntax wherein each one of the plurality of command records includes default values for connections not designated by the template syntax, and a map of the template syntax to a hardware design language describing the leaf cell in which non designated connections have default values. An article of manufacture has a computer readable media having the data structure for causing a suitably programmed system to execute the template syntax.

Also disclosed is a system for instantiating a leaf cell. The system includes storage that holds a plurality of commands having a template syntax language wherein at least some of the connections of a template syntax have default values associated therewith, and a parsing mechanism that recognizes a template syntax and calls a hardware description language for a leaf cell, and a value mechanism that places a default value on a connection when a value is not provided in the template syntax, or places a value on the connection when it is set forth in the template syntax.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of instantiating a leaf cell having various connections and designed to be called using a fixed syntax, the method comprising:

defining a template syntax different from the fixed syntax;

setting default values for connections not designated by the template syntax; and mapping the template syntax to a hardware design language describing the leaf cell in which designated connections and non designated connections have values.

2. The method of claim 1, further comprising calling a leaf cell using the template syntax.

3. The method of claim 1, further comprising calling a leaf cell using the template syntax in which less than all the connections are designated.

4. The method of claim 3, further comprising setting variables to reference positional nets matching the leaf cell called.

5. The method of claim 1, wherein the hardware design language describing the leaf cell is a Verilog statement.

6. The method of claim 1, further comprising defining a second template syntax different than the first template syntax and the fixed syntax, the second template syntax for instantiating the same leaf cell as the first template syntax or the fixed syntax.

7. An article of manufacture comprising a computer readable media having instructions thereon for causing a suitably programmed system to execute the method of claim 1.

8. A method of instantiating a leaf cell having various connections and designed to be called using a fixed syntax, the method comprising;

defining a first template syntax different from the fixed syntax;

defining a second template syntax different from the fixed syntax and different from the first template syntax; and mapping the first template syntax and the second template syntax to a hardware design language describing the leaf cell in which designated connections have values.

9. The method of claim 8, further comprising setting default values for connections not designated by the first template syntax.

10. The method of claim 8, further comprising:

setting default values for connections not designated by the first template syntax; and setting default values for connections not designated by the second template syntax.

11. The method of claim 8, further comprising calling a leaf cell using the first template syntax.

12. The method of claim 11, further comprising setting variables to reference positional nets matching the leaf cell called.

13. The method of claim 8, further comprising calling a leaf cell using the second template syntax.

14. The method of claim 8, wherein the hardware design language describing the leaf cell is a Verilog statement.

15. An article of manufacture comprising a computer readable media having instructions thereon for causing a suitably programmed system to execute the method of claim 8.

16. A method of instantiating a plurality of leaf cells having various connections and designed to be called using a fixed syntax, the method comprising:

defining a template syntax different from the fixed syntax, the template syntax defining a first leaf cell and a second leaf cell; and mapping the template syntax to a hardware design language describing the first leaf cell and the second leaf cell and the connections to one another, the template syntax including default values for connections not designated by the template syntax.

17. The method of claim 16 further comprising:

setting default values for connections not designated by the template syntax for the first leaf cell; and setting default values for connections not designated by the template syntax for the second leaf cell.

18. The method of claim 16 wherein mapping the template syntax to a hardware design language describing the first leaf cell and the second leaf cell and the connections to one another further includes designating default values for the first leaf cell and the second leaf cell for connections not designated by the template syntax.

19. An article of manufacture comprising a computer readable media having instructions thereon for causing a suitably programmed system to execute the method of claim 16.

* * * * *

UNITED STATES PATENT AND TRADEMARK OFFICE
CERTIFICATE OF CORRECTION

PATENT NO. : 6,789,249 B2
DATED : September 7, 2004
INVENTOR(S) : Lutz

It is certified that error appears in the above-identified patent and that said Letters Patent is hereby corrected as shown below:

Column 4,
Line 1, after "7" delete "is".
Line 2, delete "VerilogHardware" and insert -- Verilog Hardware --, therefor.
Line 43, delete "Verilong" and insert -- Verilog --, therefor.

Column 5,
Line 49, delete "refernce" and insert -- reference --, therefor.
Line 60, delete "in" before "BGD.".

Column 6,
Line 17, delete "[DELIM}" and insert -- [DELIM] --, therefor.
Line 26, delete "$31|$4+$5&$6" and insert -- $3|$4+$5&$6 --, therefor.
Line 65, delete "a" before "match".

Column 9,
Line 23, delete "(in_net)10 );" and insert -- (in_net) ); --, therefor.
Line 38, delete "net${I}" and insert -- net${1} --, therefor.

Column 11,
Line 59, delete "comprising;" and insert -- comprising: --, therefor.

Signed and Sealed this

First Day of February, 2005

JON W. DUDAS
*Director of the United States Patent and Trademark Office*